United States Patent
Hanson et al.

(10) Patent No.: US 7,473,613 B2
(45) Date of Patent: *Jan. 6, 2009

(54) TERRACED FILM STACK

(75) Inventors: Robert J. Hanson, Boise, ID (US); Alex Schrinsky, Boise, ID (US); Terry McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/757,594

(22) Filed: Jun. 4, 2007

(65) Prior Publication Data

US 2007/0231995 A1 Oct. 4, 2007

Related U.S. Application Data

(63) Continuation of application No. 11/158,220, filed on Jun. 21, 2005, now Pat. No. 7,262,053.

(51) Int. Cl.
*H01L 21/20* (2006.01)

(52) U.S. Cl. ............... 438/396; 257/300; 257/E21.646
(58) Field of Classification Search ............... 438/397, 438/638, 668, 671; 257/68, 300, E21.646, 257/E27.084
See application file for complete search history.

(56) References Cited

U.S. PATENT DOCUMENTS

| 6,200,853 | B1 | 3/2001 | Iwasaki |
| 7,262,053 | B2* | 8/2007 | Hanson et al. ............... 435/396 |
| 2004/0253813 | A1 | 12/2004 | Son et al. |
| 2005/0014334 | A1 | 1/2005 | Hemer et al. |

* cited by examiner

*Primary Examiner*—Quoc D Hoang
(74) *Attorney, Agent, or Firm*—Dinsmore & Shohl, LLP

(57) ABSTRACT

A process directed to forming a terraced film stack of a semiconductor device, for example, a DRAM memory device, is disclosed. The present invention addresses etch undercut resulting from materials of different etch selectivity used in the film stack, which if not addressed can cause device failure.

21 Claims, 22 Drawing Sheets

TERRACED FILM STACK

CROSS REFERENCE TO RELATED APPLICATIONS

This application is continuation of U.S. patent application Ser. No. 11/158,220 filed Jun. 21, 2005 now U.S. Pat. No. 7,262,053.

FIELD OF THE INVENTION

The present invention relates to the field of integrated circuits and, in particular, to a method and process of forming a terraced film stack in an integrated circuit, such as dynamic random access memories (DRAMs).

BACKGROUND OF THE INVENTION

As integrated circuits continue to scale to still smaller feature sizes, shrinking device geometry and differing material properties pose challenges for feature processing at 90 nm and below. One problem is that of etch undercut that occurs when etching a film stack consisting of several different materials. FIG. 22A illustrates a stack of materials to be etched using a photoresist 400. In this example, the stack consists of a metal layer 402, such as titanium, an insulating layer 404, such as tetraethylorthosilicate (TEOS) or other oxide, and other film layers, such as a polysilicon layer 406. The photoresist layer 400 is patterned on top, and all of the layers below are etched. Etch selectivity, which describes the etching rate of one material relative to the etching rate of another material, is poor between the Ti metal layer and the TEOS insulating layer. Accordingly, while polysilicon layer 406 is being cleaned, the TEOS insulating layer 404 is unintentionally etched as well, as illustrated in FIG. 22B. That is, as the polysilicon in polysilicon layer 406 underneath the TEOS insulating layer 404 is being etched vertically, the TEOS insulating layer 404 is etched laterally. Additional undercutting may further result from a subsequent cleaning prior to a deposition as depicted by FIG. 22C, resulting in an undercut trench 408. Such an undercut trench becomes difficult to reliably fill using conventional techniques without creating voids in the fill. These voids can be fatal to device performance.

SUMMARY OF THE INVENTION

It is against the above background that the present invention provides a method and apparatus directed to forming a terraced film stack in a semiconductor device, for example, a DRAM device, which provides a number of advancements and advantages over the prior art.

In one embodiment, a method of forming a memory device is disclosed. The method comprises providing a substrate assembly having underlying material layers, and providing an insulating layer over the underlying material layers. The method further includes providing a first metal layer on the insulating layer, providing a photoresist with a first pattern, and etching the insulating layer and the first metal layer through the first pattern to expose at least one of the underlying material layers, the etching defining in the insulating layer a first cavity having a first width. The method also includes etching the photoresist to provide a second pattern, etching the first metal layer through the second pattern to define a second cavity over the first cavity, the second cavity having a second width larger than the first width, removing the photoresist, and depositing a second metal layer over the substrate to fill the first and second cavities.

In another embodiment, a memory device having a terraced film stack is disclosed, which comprises a substrate assembly having underlying material layers. An insulating layer is provided over the underlying material layers. The insulating layer has a first cavity having a first width. A metal layer is provided on the insulating layer. The metal layer has a second cavity over the first cavity. The second cavity has a second width larger than the first width, and a material layer is provided over the substrate to fill the first and second cavities.

These and other features and advantages of the invention will be more fully understood from the following description of various embodiments of the invention taken together with the accompanying drawings.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION

Figure 1:
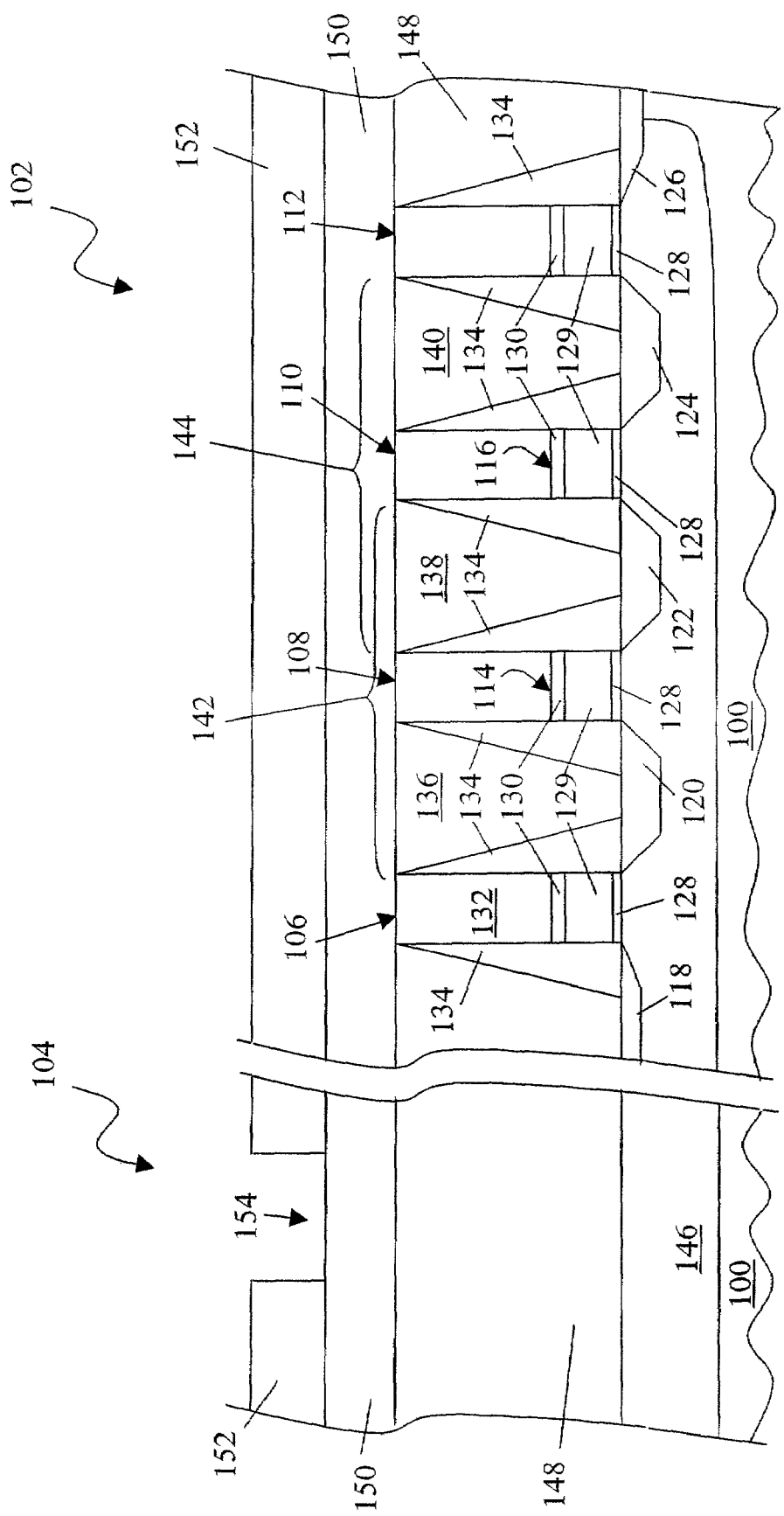
FIG. 1 is a cross-sectional view of the early stages of fabrication of a semiconductor device in accordance with an exemplary embodiment of the present invention.

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention. Additionally, well-known structures, processes, and materials associated with microelectronic device fabrication have not been shown in detail in order to avoid unnecessarily obscuring the description of the embodiments of the invention.

Furthermore, skilled artisans appreciate that elements in the figure are illustrated for simplicity and clarity and have not necessarily been drawn to scale. For example, the dimensions of some of the elements in the figure may be exaggerated relative to other elements to help to improve understanding of the various embodiments of the present invention.

The term "substrate" used in the following description may include any semiconductor-based structure that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The present invention relates to forming, during a buried bit line connection process flow, low resistance contacts to a substrate in the peripheral circuit logic area and to poly plugs in the memory cell array area formed as part of a memory device, such as a DRAM memory device. The present invention will be described as set forth in an exemplary embodiment illustrated below. Other embodiments may be used and structural or logical changes may be made without departing from the spirit or the scope of the present invention.

In accordance with the present invention, a method is provided for forming low resistance contacts for both N and P doped active regions in a peripheral logic circuitry area, which is typically formed outside of and around a memory cell array area. Referring now to the drawings, where like elements are designated by like reference numerals, FIGS. 1 through 16 illustrate exemplary embodiments of the fabrication steps and resulting structures in accordance with the present invention.

Referring to FIG. 1, a first embodiment of a semiconductor device is illustrated wherein on a substrate 100, a memory cell array indicated generally by reference numeral 102 and a peripheral circuitry area, indicated generally by reference numeral 104 are shown during an early stage of fabrication. The peripheral circuitry area 104 is typically either an N-channel transistor area or a P-channel transistor area. The memory cell array 102 includes gate stacks 106, 108, 110, 112, where in one embodiment, gate stacks 108 and 110 in the memory cell array comprise electrically isolated word lines 114, 116. Active areas are provided about the gate stacks 106, 108, 110, 112, such as the doped active areas 120, 122, 124 that form Field Effect Transistors (FETs) provided between field isolation areas 118, 126.

Each of the gate stacks 106, 108, 110, 112 includes a layer of oxide 128, such as silicon dioxide in contact with the substrate, a layer of polysilicon 129 provided on the oxide, a conductive gate layer 130 provided on the poly, an insulating cap layer 132, and insulating sidewalls 134. Provided between the gate stacks 106, 108, 110, 112 are polysilicon (poly) plugs 136, 138, 140. The polysilicon (poly) plugs 136, 140 shown in FIG. 1 will connect with subsequently formed memory cell capacitors and poly plug 138 will connect with a subsequently formed bit line. Accordingly, gate stacks 108, 110 are part of access transistors 142, 144 for respective memory cells. Additionally, gate stacks 106, 112 formed part of other memory cells in a different cross-sectional plane from that illustrated, which are used for self-aligned fabrication processes, and field oxide regions 118, 126 are used to isolating the memory cells in the memory cell array 102.

A doped well 146 may be provided in the substrate 100 and associated with a respective memory cell array 102 and peripheral circuitry area 104. For the N-channel transistors, the doped well 146 is a p-well, while for the P-channel transistors the doped well is a n-well, as is well known in the art.

As further shown in FIG. 1, planarized first insulating layer 148, formed of, for example, borophosphosilicate glass (BPSG) or silicon dioxide has been formed over the gate stacks and active areas. The first insulating layer 148 is then planarized by chemical mechanical polishing (CMP) or other suitable means. A second insulating layer 150, formed of, for example, tetraethylorthosilicate (TEOS) or other oxide, is formed over the first insulating layer 148. The second insulating layer 150 is deposited with a thickness, for low resistance contacts of current integration size and levels, in a range of about 5 Angstroms to about 10,000 Angstroms. Of course, one skilled in the art will be able to easily vary the relevant dimensions to fit the particular application. If desired, the second insulating layer 150 may also by planarized by chemical mechanical polishing (CMP) or other suitable means; however, this step may be skipped as the first insulating layer 148 is planar. The substrate assembly shown by FIG. 1 serves as the starting foundation for the invention which is discussed hereafter.

Figure 2:
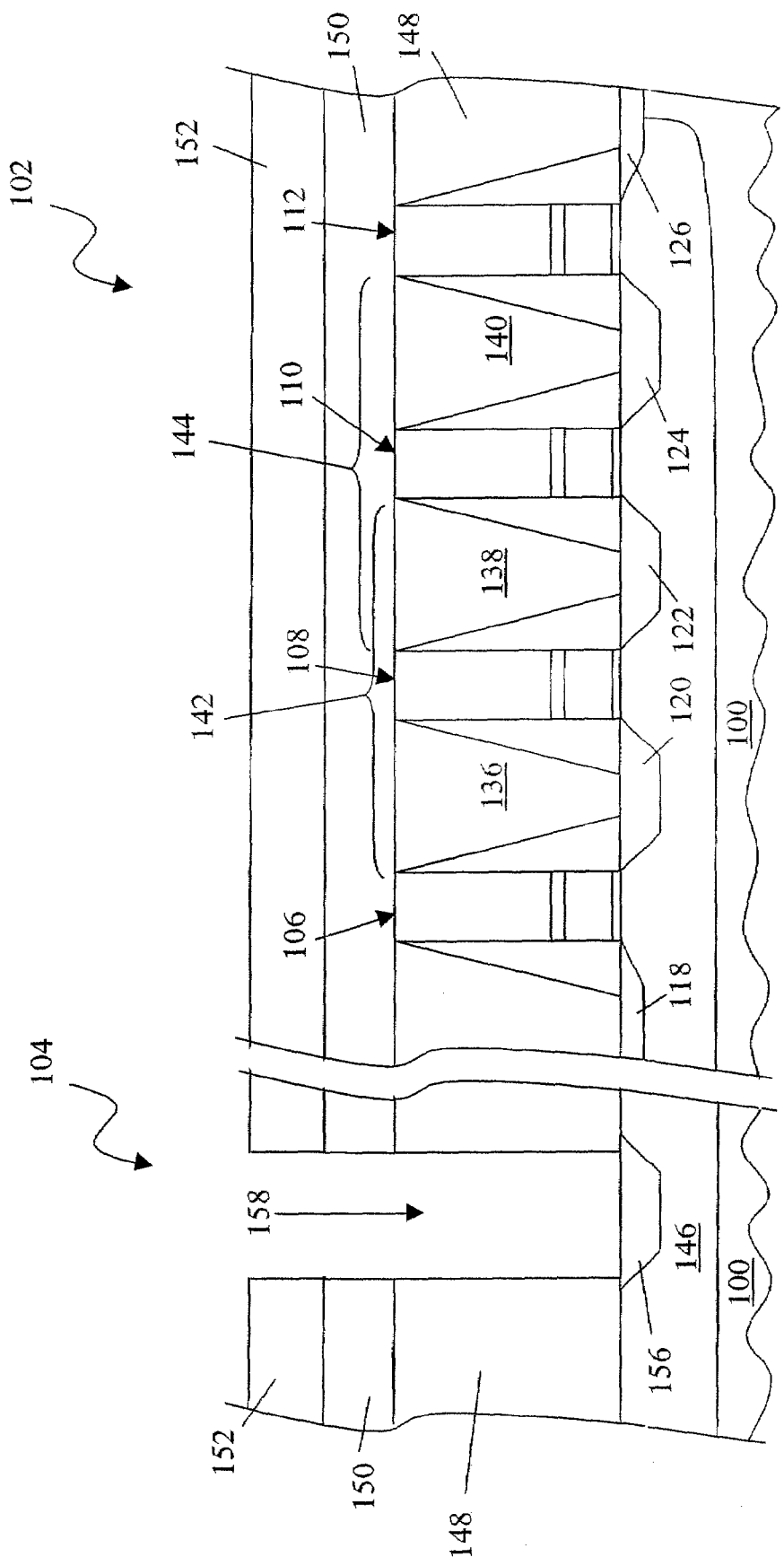
FIG. 2 shows the semiconductor device of FIG. 1 at a processing step subsequent to that shown in FIG. 1.

The process of the present invention begins by applying a photoresist mask 152 to the second insulating layer 150. Opening 154 in the mask defines an etch location of a peripheral contact to other wordlines and actives areas. As shown in FIG. 2, a first portion of the first and second insulating layers is removed by etching to expose, for example, an active area 156 which is N+ doped for N-channel transistors, and P+ doped for P-channel transistors. It is also possible to dope the active area 156 after the etching operation instead of doping such areas prior to etching. The contact opening 158 is thus provided, as shown in FIG. 2.

Figure 3:
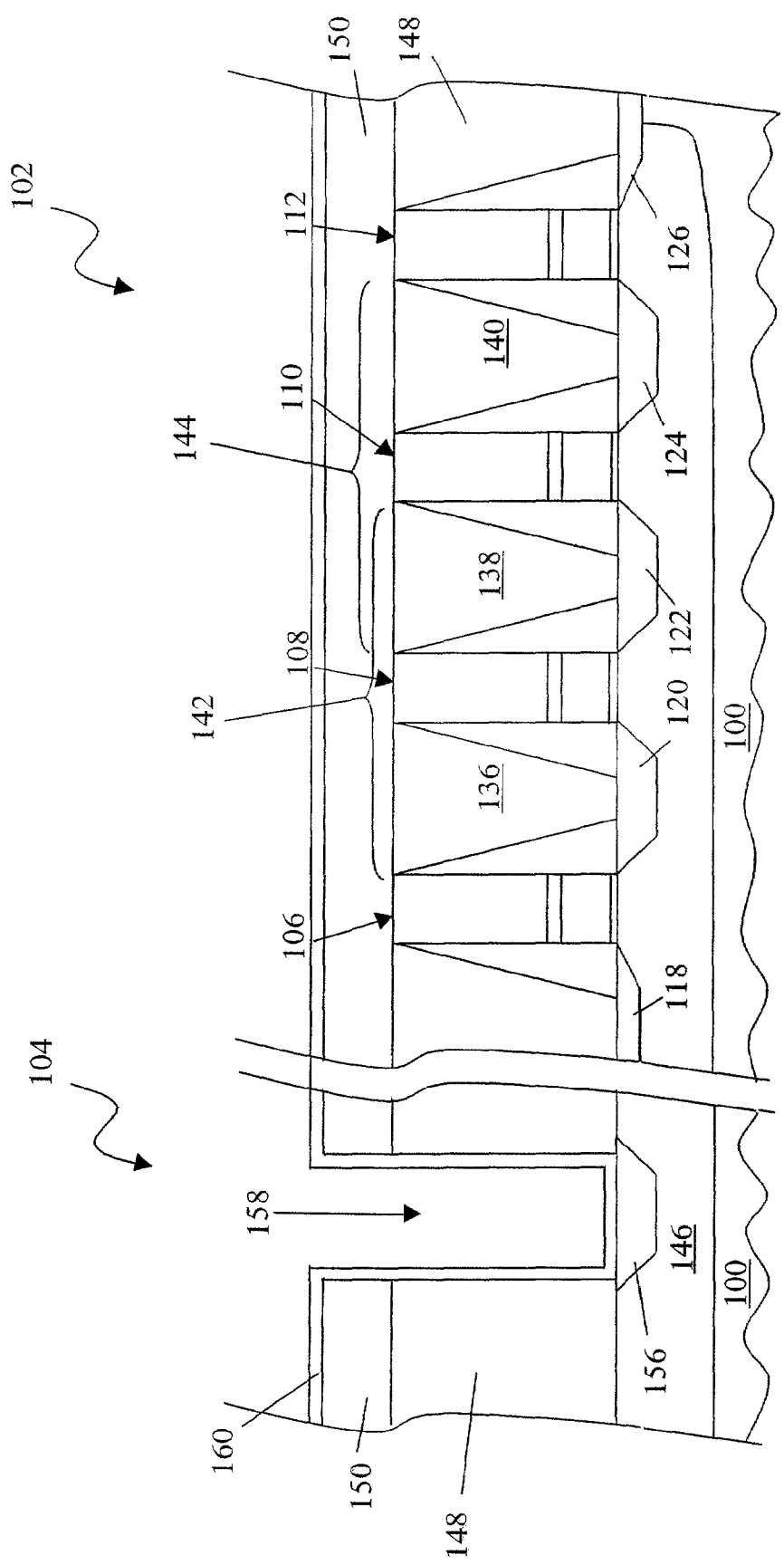
FIG. 3 shows the semiconductor device of FIG. 1 at a processing step subsequent to that shown in FIG. 2.

As shown by the structure illustrated in FIG. 3, after contact opening 158 is formed, such as by reactive ion etching (RIE), the photoresist mask 152 is removed and a low resistance metal film layer 160 is deposited by CVD over the second insulating layer 150. The metal film layer 160 is titanium which will cover the contact opening 158, and form titanium silicide (TiSi$_x$) in the peripheral circuitry area 104 in a subsequent heating cycle when the layers are annealed at temperatures above 650° C. The metal film layer 160 is deposited with a thickness in a range of about 1 Angstrom to about 5,000 Angstroms. As the second insulating layer 150 is intact over the memory cell array area 102, no CVD Ti comes into contact with poly plug 138, which will connect with a subsequently formed bit connection.

In another embodiment, TiSi$_x$ can be provided in the contact opening 158 by reacting chemically vapor deposited Ti with Si from the substrate 100 or with Si simultaneously added from the vapor phase. For example, the titanium silicide areas in the contact opening 158 may be formed by depositing Ti from the precursor TiCl$_4$, with the Si coming from the substrate 100 or from added gas-phase SiH$_4$ or SiH$_2$Cl$_2$.

Figure 4:
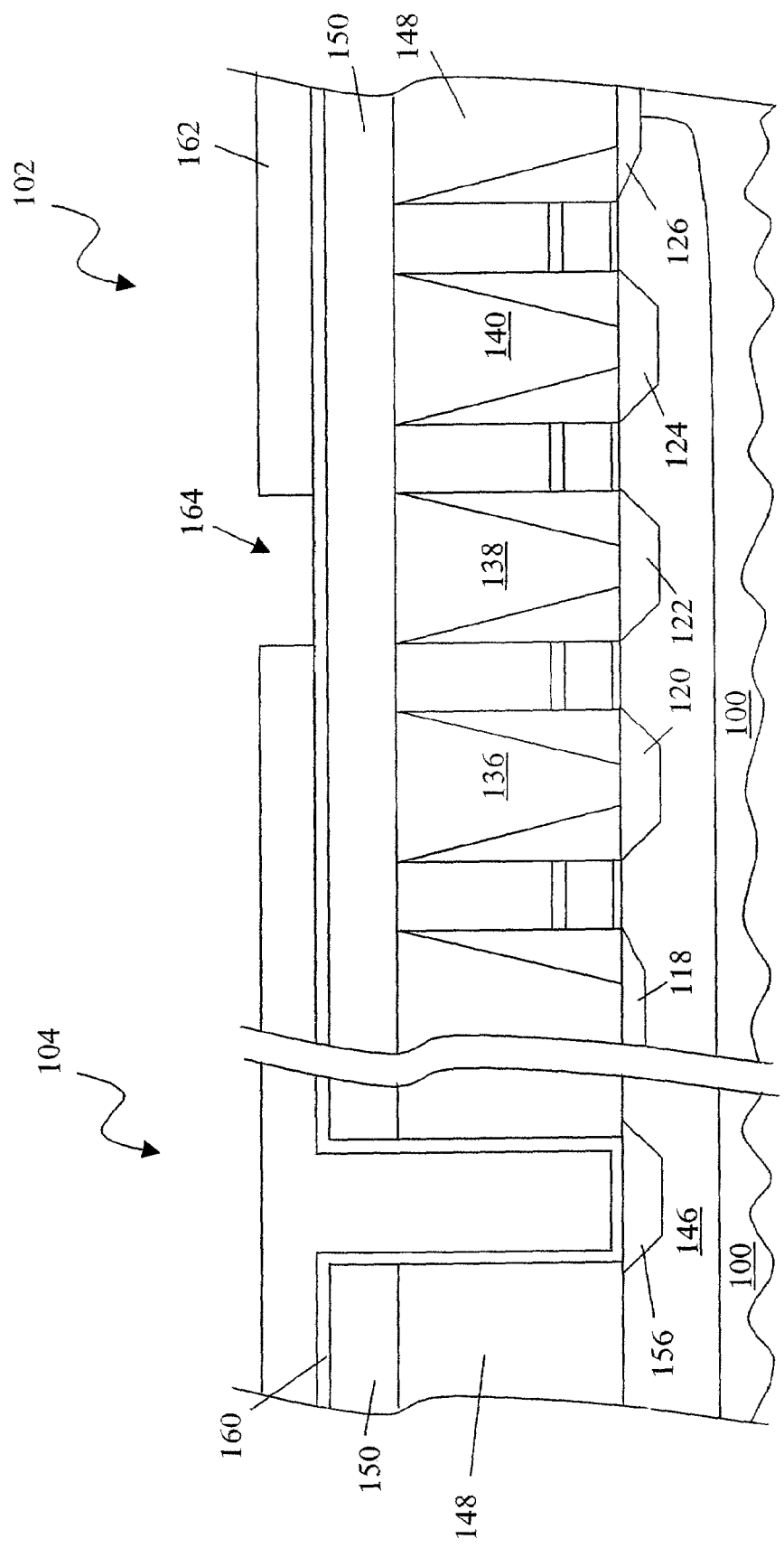
FIG. 4 shows the semiconductor device of FIG. 1 at a processing step subsequent to that shown in FIG. 3.
Figure 5:
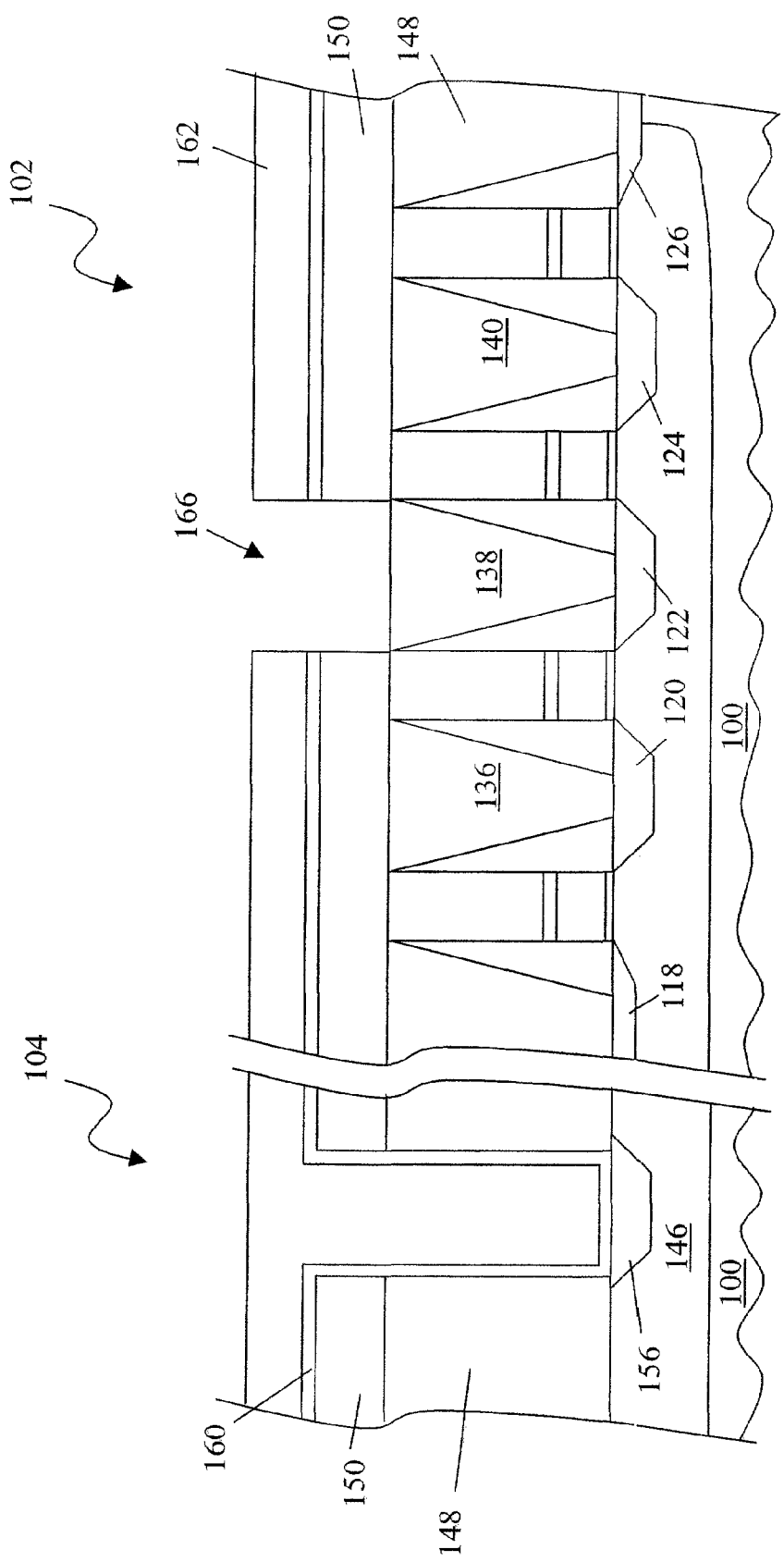
FIG. 5 shows the semiconductor device of FIG. 1 at a processing step subsequent to that shown in FIG. 4.

After Ti deposition, a second photoresist mask 162 is provided over the Ti film layer 160 to a thickness standard in the art, and patterned to provide an opening 164 located over the memory cell array area 102, and in particular poly plug 138 as illustrated by FIG. 4. As shown by the structure illustrated in FIG. 5, bit connection opening 166 is formed by anisotropically etching through the first and second insulating layers 150, 160, thereby opening the bit connections in the memory cell array area 102. It is to be appreciated that the etching process to form the bit connection openings in the memory cell array area 102 can be one or more process steps (in-situ or ex-situ).

In the first part of the bit connection opening formation process, the Ti metal film layer 160 is anisotropically etched using a reactive halogen containing plasma etch process, such as chlorine, fluorine, and the like, which is very selective and stops at the first insulating layer 150. In the second part of the bit connection opening formation process, the first insulating layer 150 is then anisotropically etched using a reactive halogen containing plasma etch process to remove the portion of the first insulating layer 150 over the bit connections, thereby exposing the bit connection poly plugs, such as for example, poly plug 138.

Figure 6:
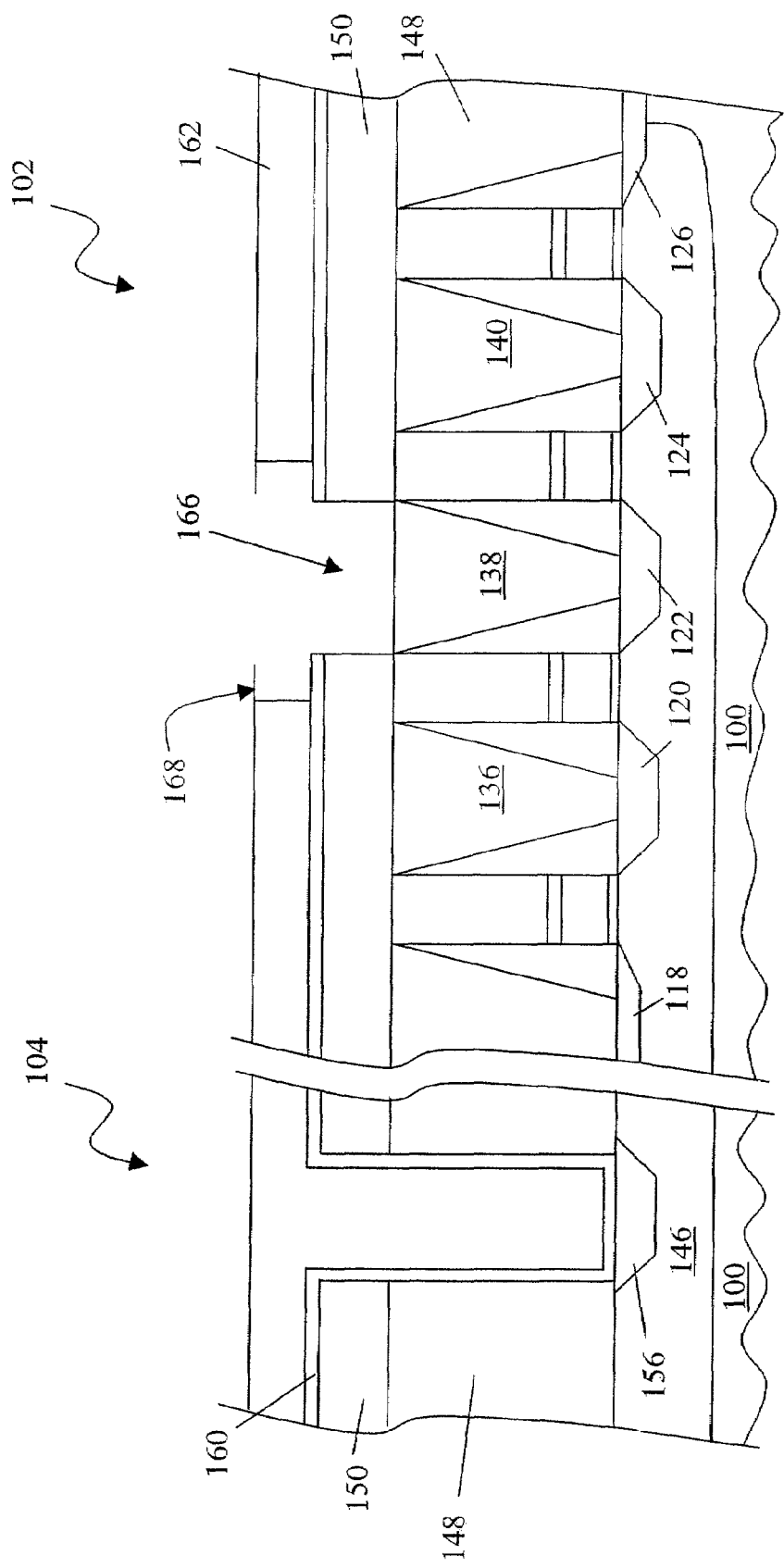
FIG. 6 shows the semiconductor device of FIG. 1 at a processing step subsequent to that shown in FIG. 5.
Figure 7:
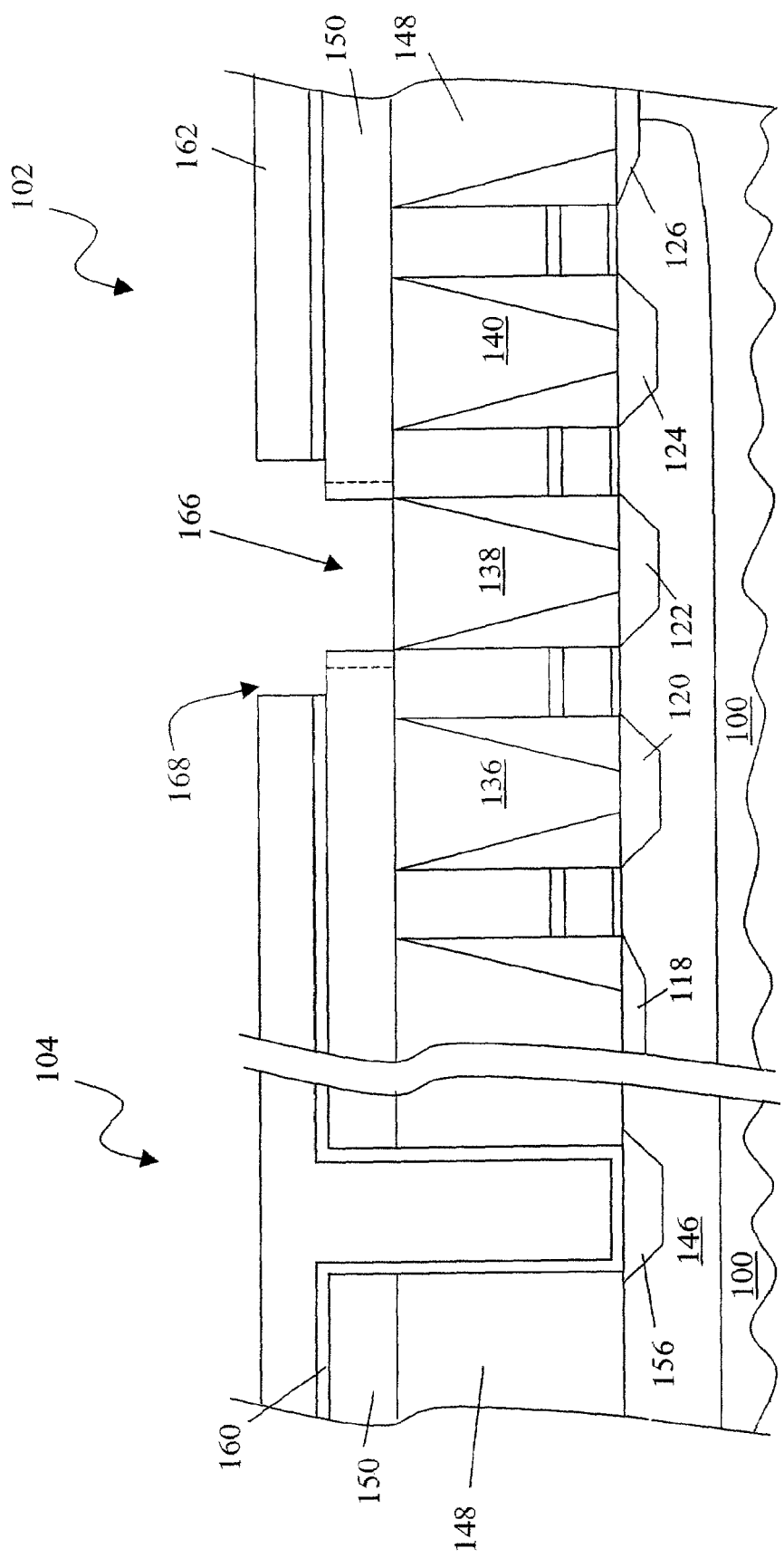
FIG. 7 shows the semiconductor device of FIG. 1 at a processing step subsequent to that shown in FIG. 6.

At this point in the bit connection opening formation process, the steps illustrated by FIGS. 6 and 7 and explained hereafter, are performed in order to provided a terrace film stack. In order to address metal undercut during a pre-clean process, such as with an aqueous or non-aqueous mixture of HF and/or NH$_4$F, to a subsequent metal deposition step, a second etch is conducted to the bit connection opening 166. To conduct the second etch, the second photoresist mask provides a second pattern having an opening 168 that is wider than the bit connection opening 166 as illustrated by FIG. 6. In one embodiment, the photoresist layer 162 is isotropically etched using an oxygen containing plasma etch process to expose precise portions of the Ti film layer 160 around the connection opening 166. Lastly, the exposed portions of the Ti film layer 160 are then anisotropically etched by a reactive halogen containing plasma etch process as is illustrated by FIG. 7.

Figure 8:
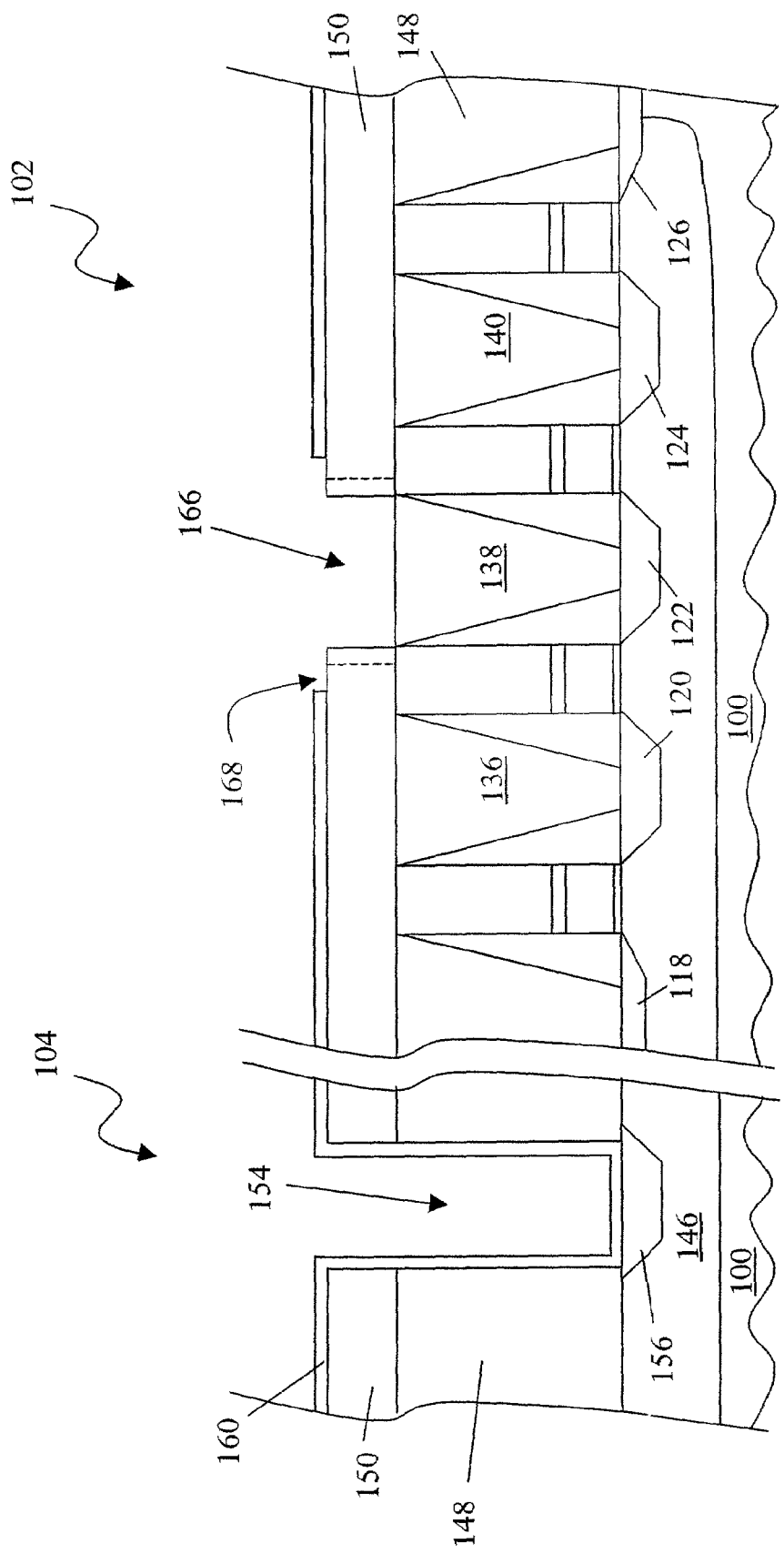
FIG. 8 shows the semiconductor device of FIG. 1 at a processing step subsequent to that shown in FIG. 7.

As shown by FIG. 8, the second photoresist mask 162 is stripped and then the metal deposition pre-clean step is performed. It is to be appreciated that the pre-clean process further widens the connection opening 166, as indicated by the dotted lines, but not as wide as opening 168. In the pre-clean process, the TEOS insulating layer 150 etches faster than the CVD Ti film layer 160, and without the widening process providing opening 168, the Ti film layer 160 would most likely get undercut. The trimming of the photoresist layer 152 and subsequent additional Ti etch will result in a terraced film stack as illustrated in the subsequent process flow which prevents void formation in the bit connection.

Figure 9:
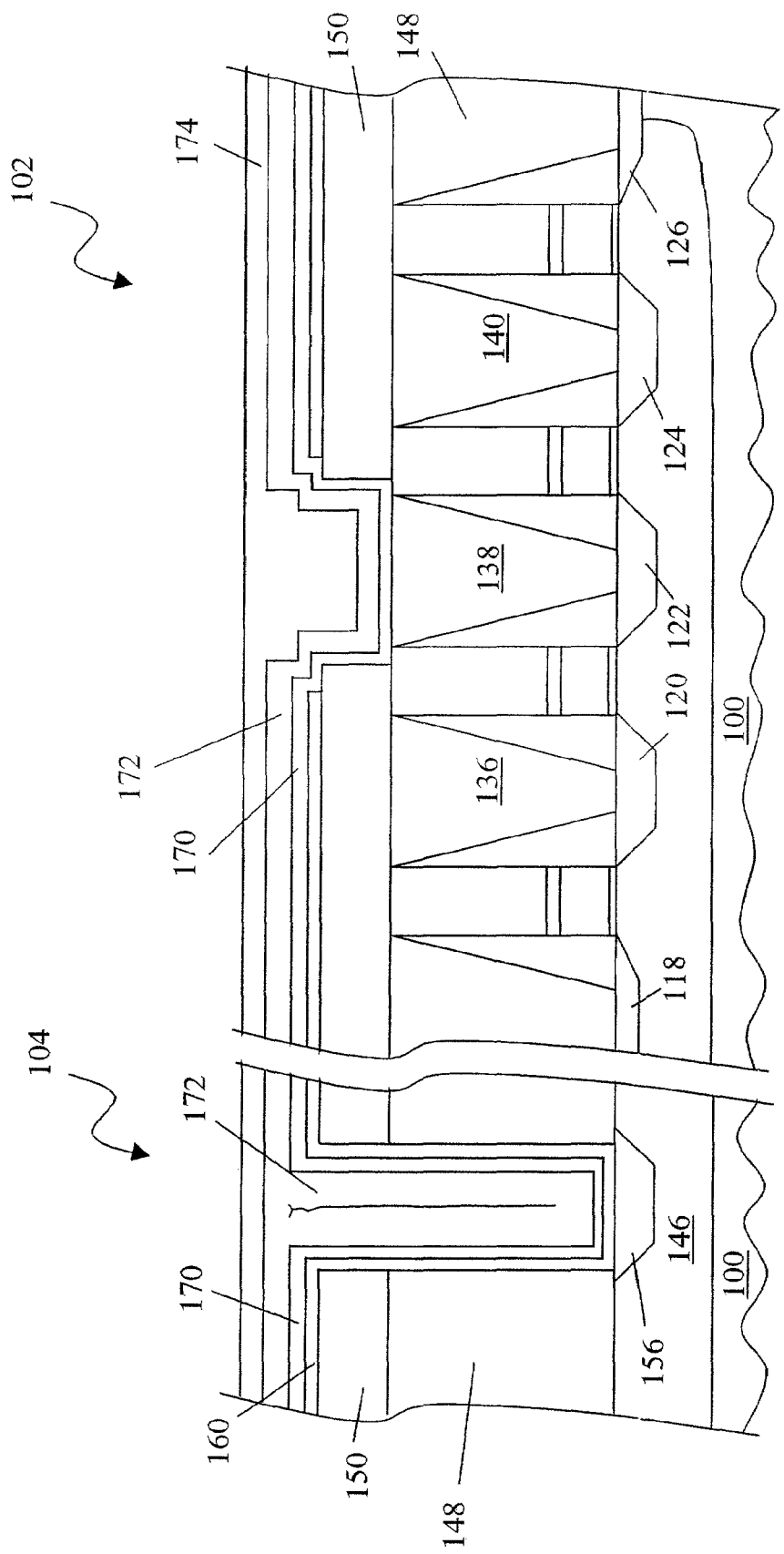
FIG. 9 shows the semiconductor device of FIG. 1 at a processing step subsequent to that shown in FIG. 8.

Referring now to FIG. 9, after the formation and cleaning of the contact opening, a low-resistivity metal mode titanium/tungsten nitride/tungsten (MMTI/WN/W) terraced film stack is provided. First, a metal mode (metallic) titanium film layer 170 is deposited, using a physical vapor deposition (PVD) process, over the memory cell array and peripheral circuitry areas 102 and 104, respectively, which fills into the openings 154, 166, 168 (FIG. 8). It is to be appreciated that the metal mode titanium film layer 170 does not form silicides or ultra thin silicides, thus providing good contact to the poly plug 138 without voiding. The metal mode titanium film layer 170 is deposited with a thickness in a range of about 1 Angstrom to about 5000 Angstroms.

Next the WN/W layer 172 is deposited using either a PVD or CVD process, which completely fills the peripheral contact opening 154. The WN/W film layer 172 is deposited with a thickness in a range of about 5 Angstroms to about 5000 Angstroms. Finally, a nitride capping layer 174 is deposited and planarized to have a thickness in a range of about 100 Angstroms to about 10,000 Angstroms.

Figure 10:
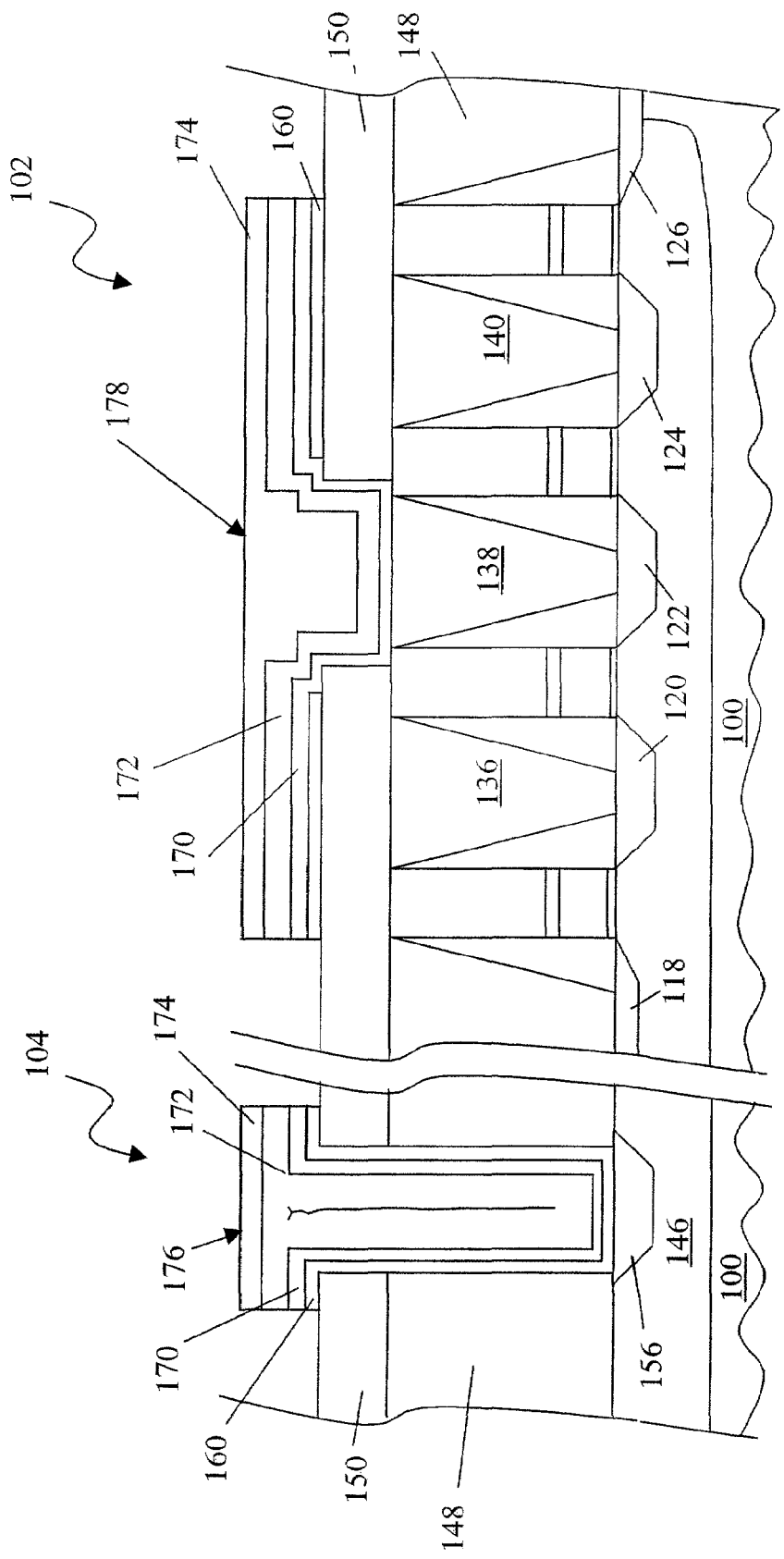
FIG. 10 shows the semiconductor device of FIG. 1 at a processing step subsequent to that shown in FIG. 9.

As shown in FIG. 10, a directional etching process or other suitable process is used to etch through a photoresist mask (not shown) to remove portions of layers 160, 170, 172, 174 in areas not desired and in order to form low resistance contacts 176, 178. The contacts 176, 178 may be of any suitable size and shape so as to provide a low resistance vertical path to the active areas 122, 146. The contacts, such as contact 176, in the peripheral circuitry area 104 are preferably of a smaller area than the contacts, such as contact 178, in the memory cell array area 102.

Figure 11:
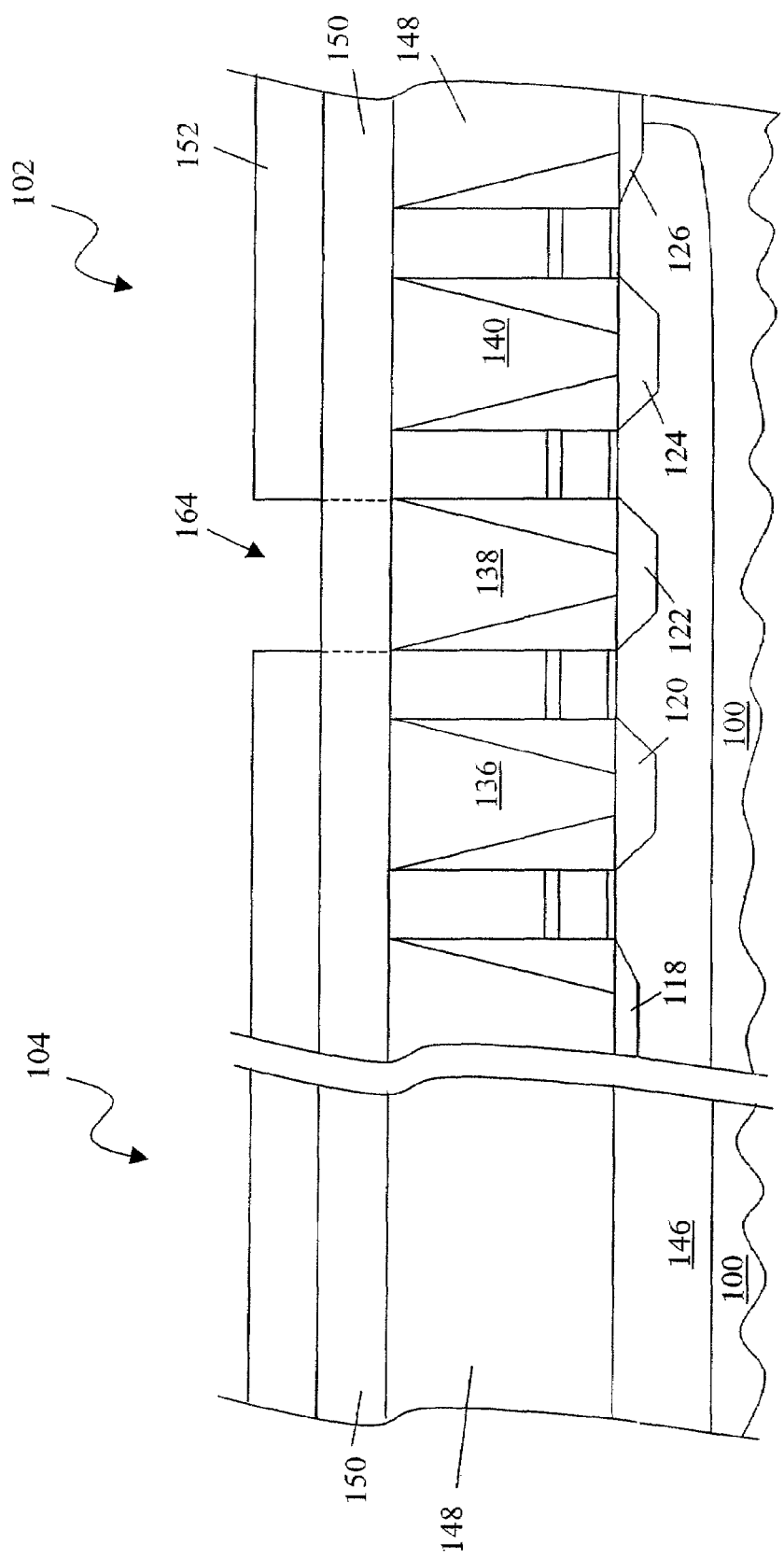
FIG. 11 shows the semiconductor device of FIG. 1 at a processing step according to an alternate embodiment of the present invention.

An alternate embodiment is described with reference to FIGS. 11-16. Like numerals from the first described embodiment are utilized where appropriate, with differences being indicated by 200 series numerals or with different numerals. FIG. 11, shows a processing step conducted similar to the processing steps shown in FIG. 1, except that the first photoresist mask 152 is patterned to provide the contact opening 164 in the memory cell array area 102, and not the peripheral circuitry area 104 as in FIG. 1. A directional etching process or other suitable process occurs to etch through the first insulating layer 150 as indicated by the dotted lines in FIG. 11, thus exposing poly plug 138.

Figure 12:
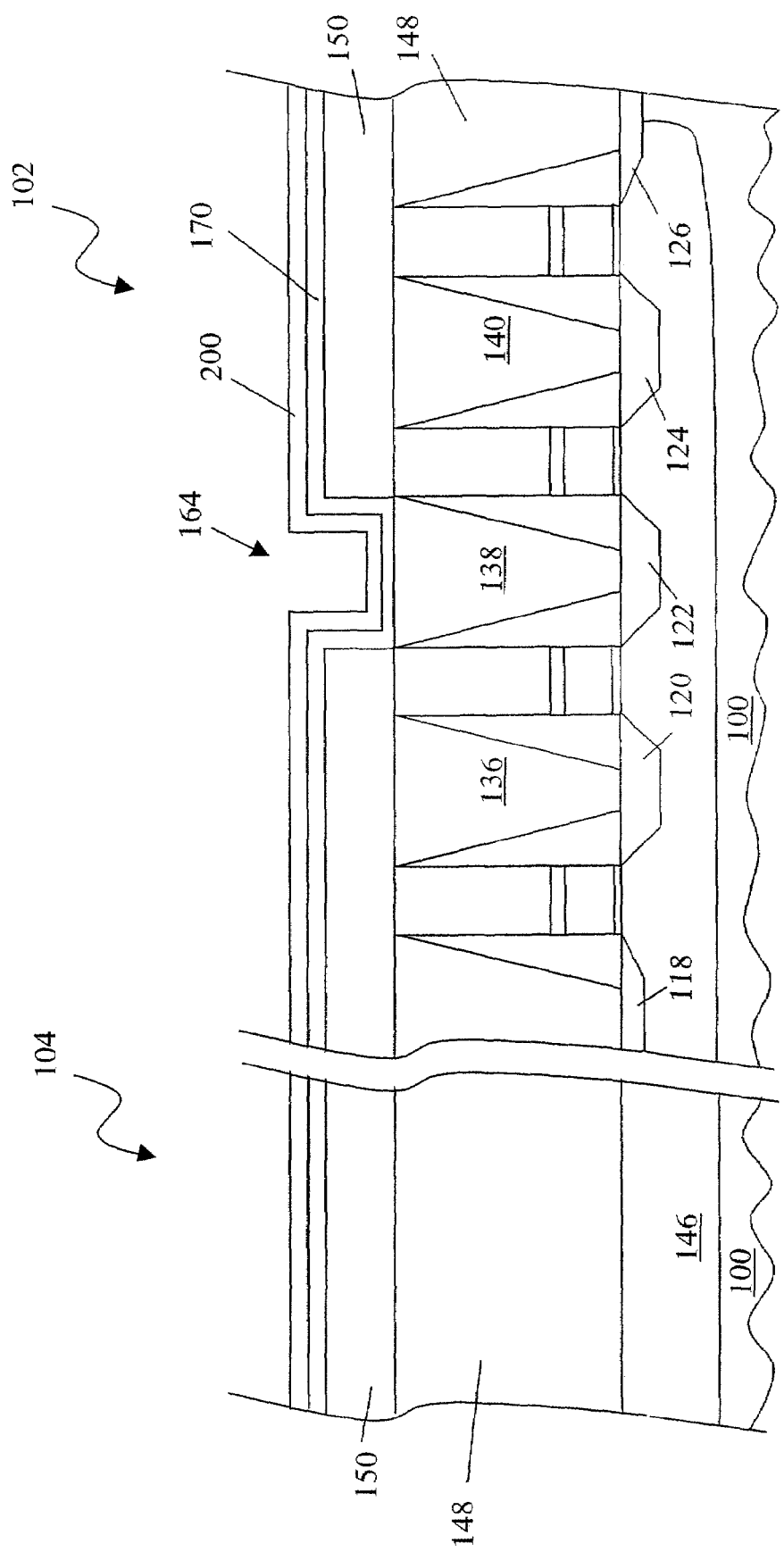
FIG. 12 shows the semiconductor device of FIG. 1 at a processing step subsequent to that shown in FIG. 11 according to an alternate embodiment of the present invention.

Referring to FIG. 12, the photoresist mask layer 152 is then removed after the etching process, and the metal mode titanium layer 170 is deposited over the memory cell array and the peripheral circuitry areas 102 and 104, respectively. The metal mode deposition is then followed by a deposition of a tungsten nitride layer 200. Accordingly, the metal mode titanium layer 170 is formed over the exposed outer surfaces of poly plug 138. Alternatively, layer 170 may comprise titanium, titanium nitride, tungsten, cobalt, molybdenum or tantalum, but any suitable metal may be used. Additionally, each layer 170, 200 may be planarized by, for example, by CMP after deposition.

Figure 13:
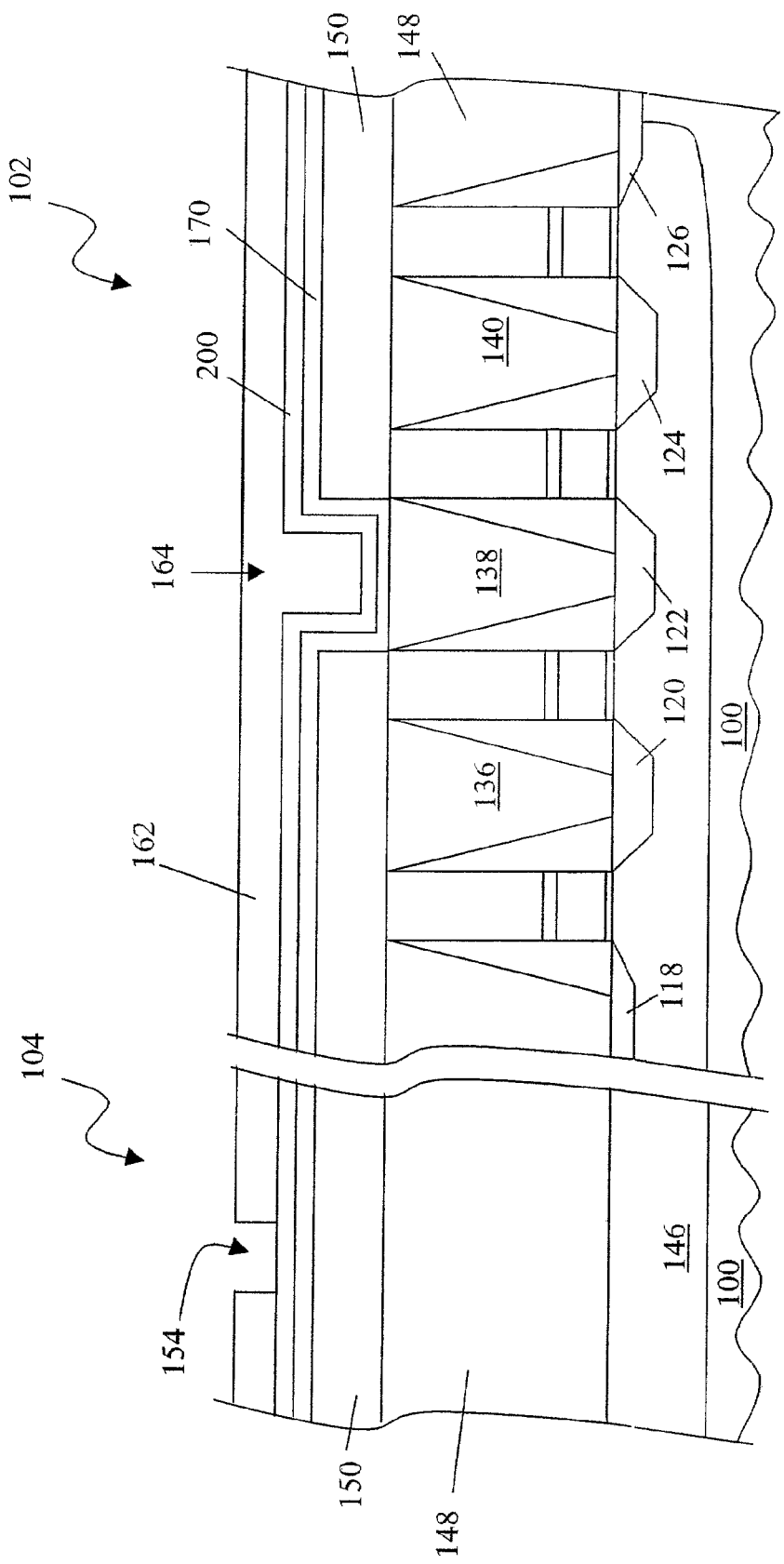
FIG. 13 shows the semiconductor device of FIG. 1 at a processing step subsequent to that shown in FIG. 12 according to an alternate embodiment of the present invention.

As shown in FIG. 13, the second photoresist layer 162 has been deposited over the substrate to fill opening 164 above the poly plug 138. The photoresist layer 162 is then patterned to form the etching opening 154 for the subsequently formed peripheral contact.

Figure 14:
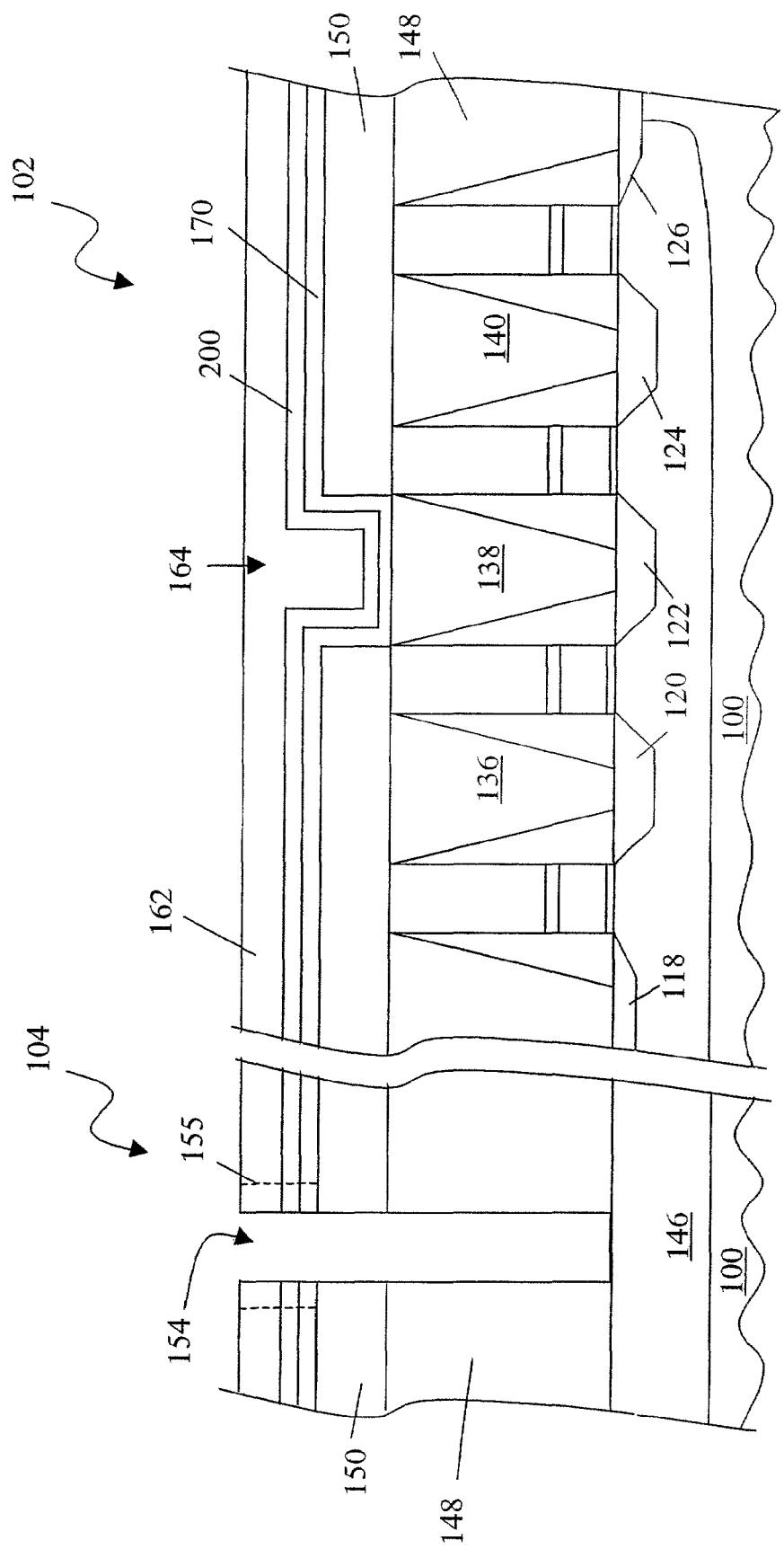
FIG. 14 shows the semiconductor device of FIG. 1 at a processing step subsequent to that shown in FIG. 13 according to an alternate embodiment of the present invention.

As shown in FIG. 14, a directional etching or other suitable etch process is performed to etch through layers 148, 150, 170, and 200 to form the contact opening 154 so as to expose a contact area in the substrate 100. It is to be appreciated that the metal mode titanium layer 170 and tungsten nitride layer 200 are used as a hard mask if needed, such that only the first and second insulating layers 148, 150 are etched after etching portions of layers 170, 200 with the directional etching process. The contact opening 154 in one embodiment is of a smaller diameter than the opening 164 above the poly plug 138.

After formation of the peripheral contact opening 154, the process steps for forming the terraced film stack as explained previously above in reference to FIGS. 6 and 7 is conducted. As explained above, the second photoresist layer 162 is used again to provide an opening that is wider than the contact opening 154. In one embodiment, the second photoresist layer 162 is isotropically etched using an oxygen containing plasma etch process to expose precise portions of the tungsten nitride layer 200 around the connection opening 154. Lastly, the exposed portions of the tungsten nitride layer 200 and the underling metal mode titanium layer 170 are then anisotropically etched by a reactive halogen containing plasma etch process to widen opening 154 to the dashed line 155.

Figure 15:
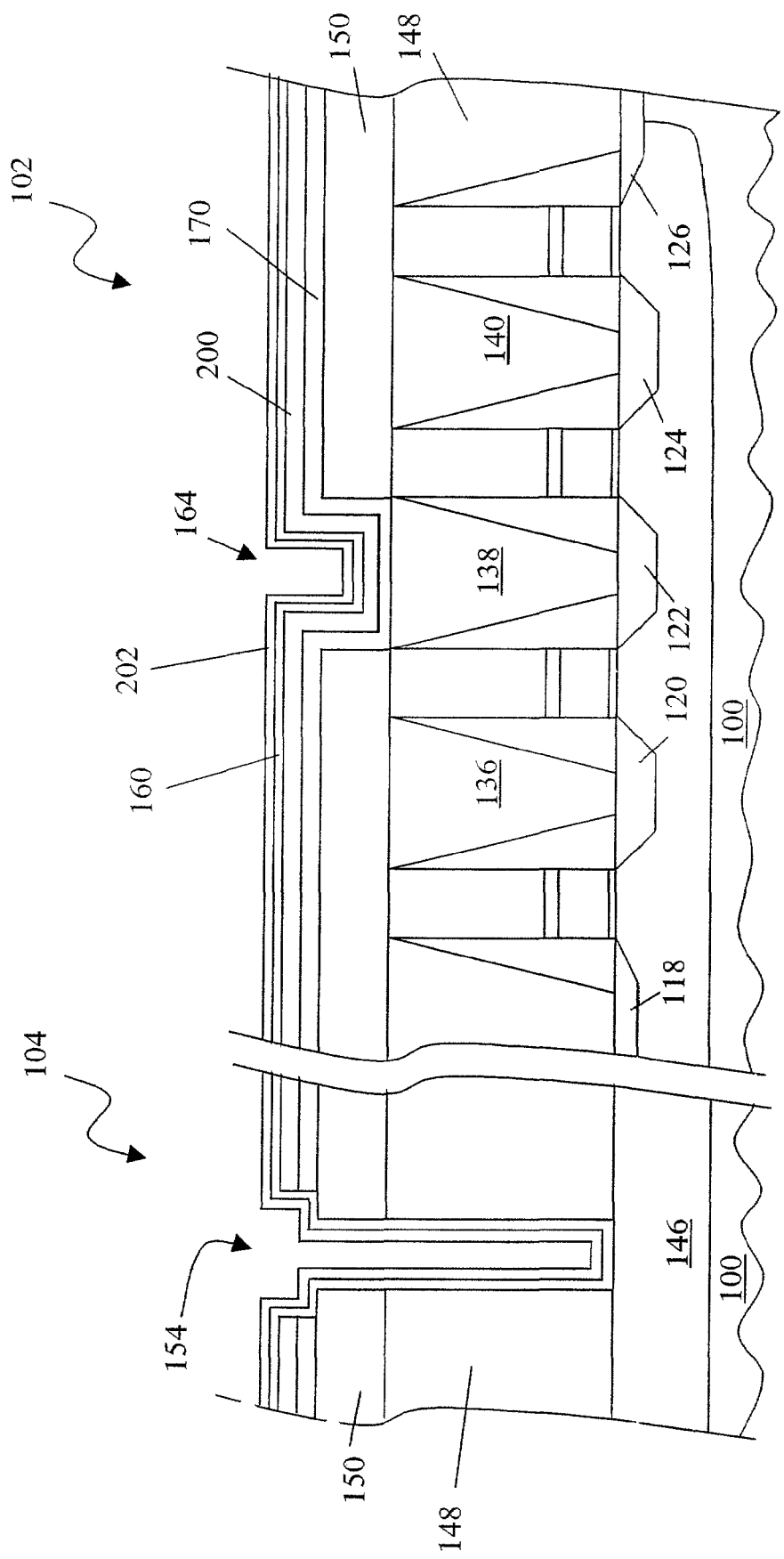
FIG. 15 shows the semiconductor device of FIG. 1 at a processing step subsequent to that shown in FIG. 14 according to an alternate embodiment of the present invention.
Figure 16:
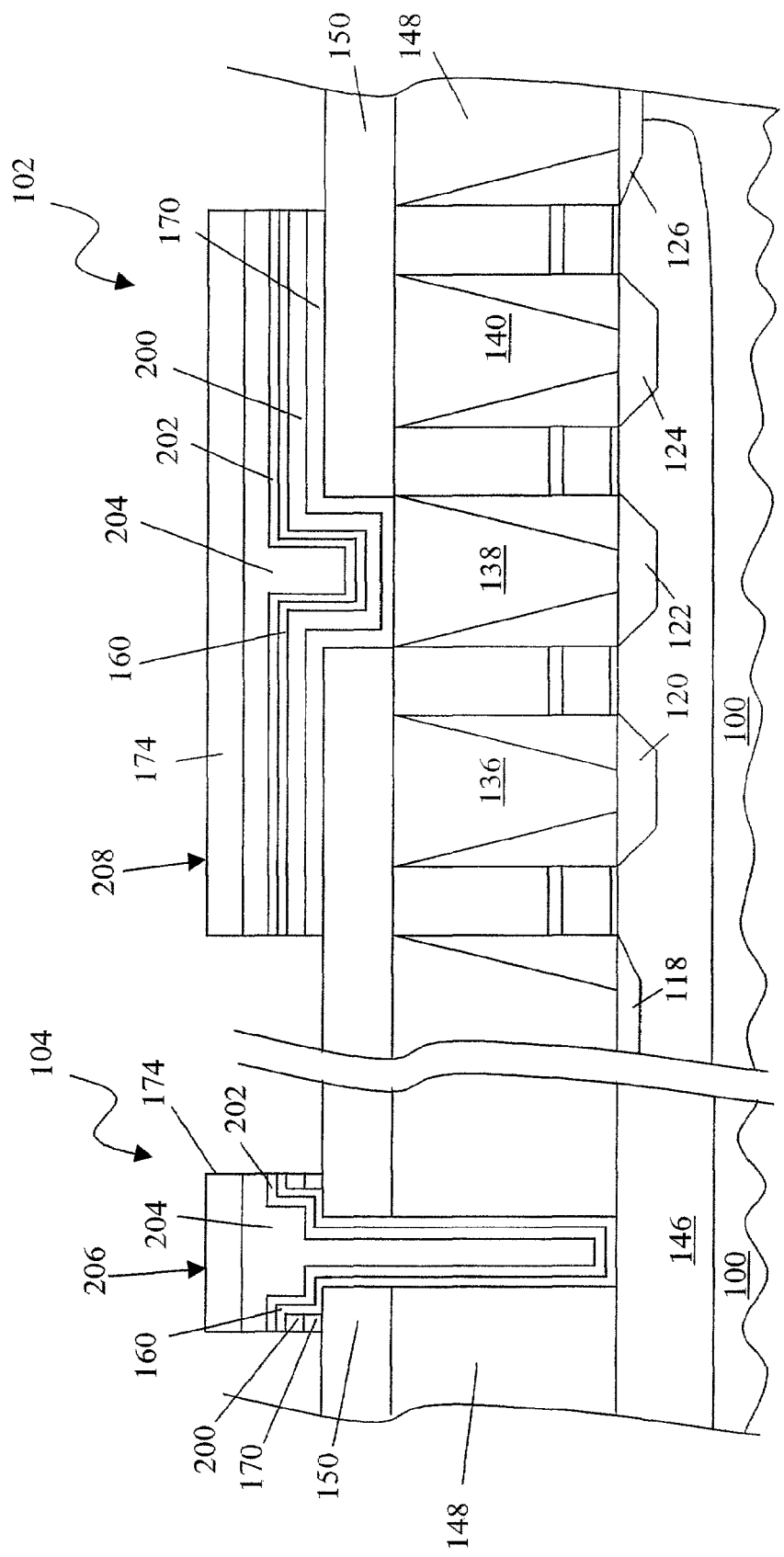
FIG. 16 shows the semiconductor device of FIG. 1 at a processing step subsequent to that shown in FIG. 15 according to an alternate embodiment of the present invention.

Next, the second photoresist layer 162 is striped away, and the titanium layer 160 is deposited by CVD as shown by FIG. 15. As mentioned previously above, the CVD Ti layer 160 provides a low resistance periphery contact, which due to the process flow illustrated in FIGS. 11-14, does not coming into contact with the poly plug 138 in the memory cell array area 102, thus preventing voiding. An adhesion/barrier layer 202 formed from a suitable material such as titanium nitride is then deposited by CVD or other suitable deposition process. This deposition is then followed by a conductive layer 204 formed from a suitable conductive material such as tungsten or other metal to fill the contact opening 154 as illustrated by FIG. 16. The nitride capping layer 174 is then deposited and layers 174, 204, 202, 160, 200, 170 are etched and patterned so as to form contacts 206, 208 having a top portion situated on the second insulating layer 150 as also shown by FIG. 16. The contacts 206, 208 may be of any suitable size and shape so as to provide a low resistance vertical path to the active areas of the memory cell array and peripheral circuitry areas 102 and 104, respectively.

In accordance with the present invention the contacts are formed after the formation of the capacitors. In particular, the process of forming the contacts begins after the completion of all high temperature processing steps utilized in wafer fabrication and after any other temperature changes that affect the metal layers provided in the contact formation process. In one embodiment, the process begins after the heat cycles used for cell poly activation and capacitor formation. The contacts may be formed prior to forming upper cell plate contacts to the capacitor of the memory device but subsequent to high temperature processing treatment for the capacitor. Furthermore, the present invention is not limited to the illustrated layers. Any suitable number and/or arrangement of conductive and insulating layers may be used without departing from the spirit of the invention.

Figure 17:
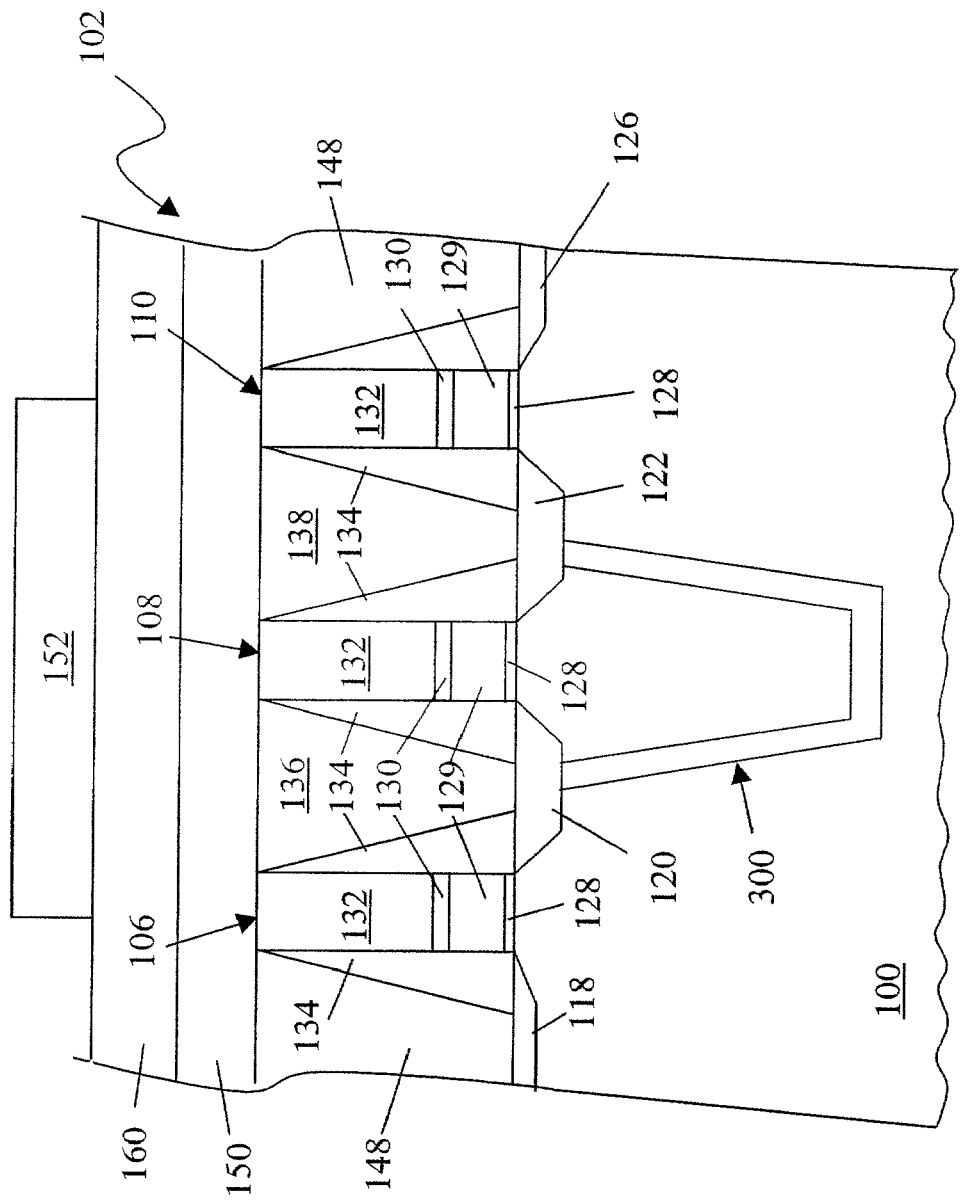
FIG. 17 shows another embodiment of a semiconductor device at a processing step according to another alternative embodiment of the present invention.

For example, referring to FIG. 17, a second embodiment of a semiconductor device is illustrated, wherein like numerals from the first described embodiment are utilized where appropriate, with differences being indicated by 300 series numerals or with different numerals. On a substrate 100, a memory cell array indicated generally by reference numeral 102 is shown during an early stage of fabrication. The memory cell array 102 includes gate stacks 106, 108, 110. Active areas are provided about the gate stacks 106, 108, 110, such as the doped active areas 120, 122, that form Field Effect Transistors (FETs) provided between field isolation areas 118, 126.

Each of the gate stacks 106, 108, 110, includes a layer of oxide 128, such as silicon dioxide in contact with the substrate, a layer of polysilicon 129 provided on the oxide, a conductive gate layer 130 provided on the poly, an insulating cap layer 132, and insulating sidewalls 134. Provided between the gate stacks 106, 108, 110, are polysilicon (poly) plugs 136, 138. Additionally, a trench capacitor, generally indicated by symbol 300, is provide below the gate stacks, and in particular, centrally below gate stack 108.

As further shown in FIG. 17, a first insulating layer 148, formed of, for example, borophosphosilicate glass (BPSG) or silicon dioxide surrounds the gate stacks 106, 108, 110 and remaining active areas. The first insulating layer 148 and insulating cap layer 132 is planarized, such as by chemical mechanical polishing (CMP) or other suitable means.

A second insulating layer 150, formed of, for example, tetraethylorthosilicate (TEOS) or other oxide, is formed over the first insulating layer 148 and insulating cap layer 132. The second insulating layer 150 is deposited with a thickness, for low resistance contacts of current integration size and levels, in a range of about 5 Angstroms to about 10,000 Angstroms. Of course, one skilled in the art will be able to easily vary the relevant dimensions to fit the particular application. If desired, the second insulating layer 150 may also by planarized by chemical mechanical polishing (CMP) or other suitable means; however, this step may be skipped as the first insulating layer 148 is planar. A low resistance metal film layer 160 is deposited by CVD over the second insulating layer 150. In one embodiment, the metal film layer 160 is titanium or other suitable metal or metal based film. The metal film layer 160 is deposited with a thickness in a range of about 1 Angstrom to about 5,000 Angstroms.

Figure 18:
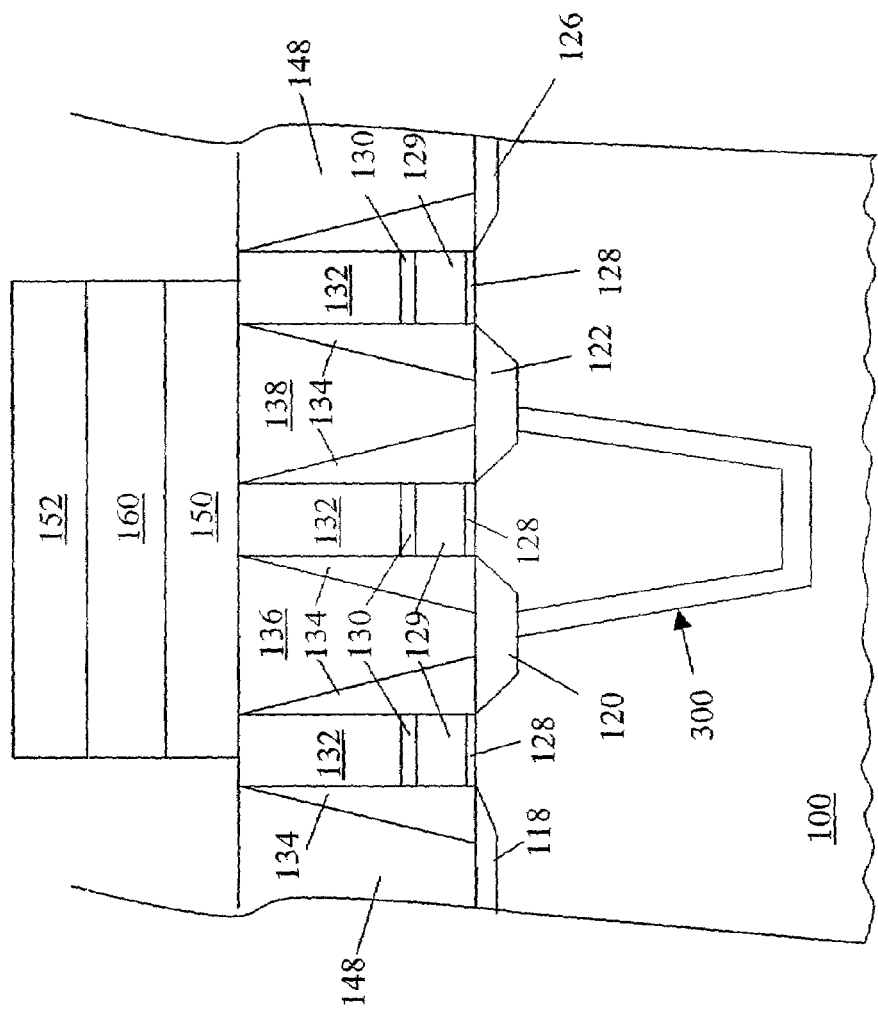
FIG. 18 shows the semiconductor device of FIG. 17 at a processing step subsequent to that shown in FIG. 17 according to an alternate embodiment of the present invention.

Next, the process of the present invention begins by applying a photoresist mask 152 to the metal film layer 160. The openings in the mask defines etch locations, and as shown in FIG. 18, portions of the second insulating layer 150 and metal film layer 160 are removed by etching to expose, for example, portions of the insulating cap layer 132 and the first insulating layer 148.

Figure 19:
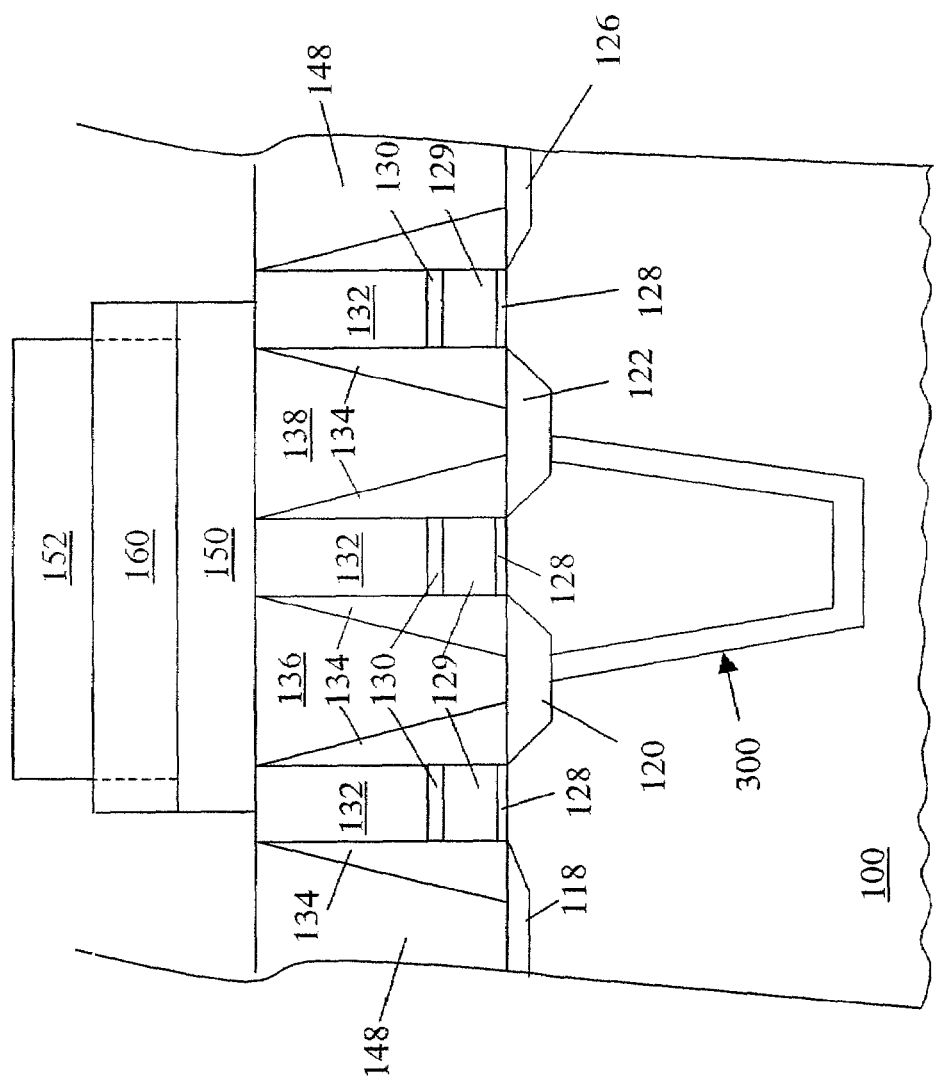
FIG. 19 shows the semiconductor device of FIG. 17 at a processing step subsequent to that shown in FIG. 18 according to an alternate embodiment of the present invention.

A second etch is then conducted to the metal film layer 160. To conduct the second etch, the photoresist mask 152 provides a second pattern having openings wider than the previous pattern openings illustrated by FIG. 17. In one embodiment, the photoresist layer 152 is isotropically etched using an oxygen containing plasma etch process to expose precise portions of the metal film layer 160. Lastly, the exposed portions of the metal film layer 160 are then anisotropically etched by a reactive halogen containing plasma etch process as is illustrated by the dotted lines in FIG. 19.

Figure 20:
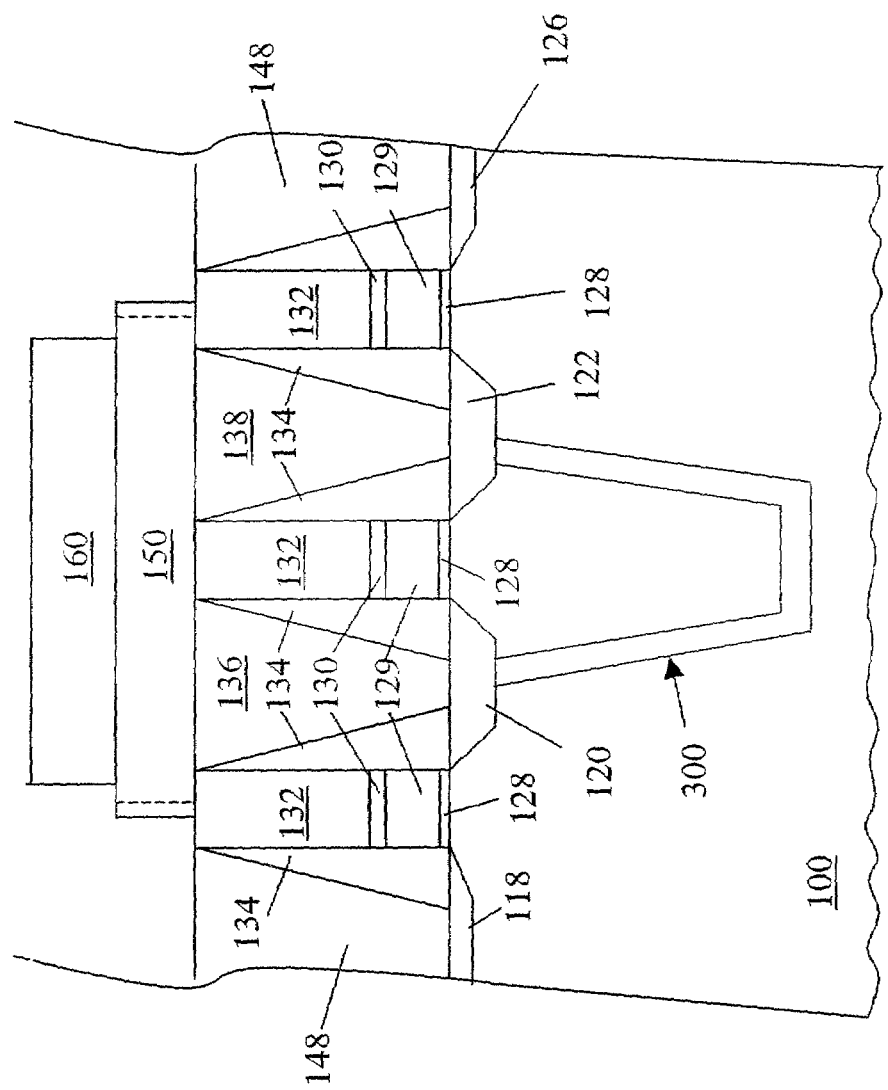
FIG. 20 shows the semiconductor device of FIG. 17 at a processing step subsequent to that shown in FIG. 19 according to an alternate embodiment of the present invention.
Figure 21:
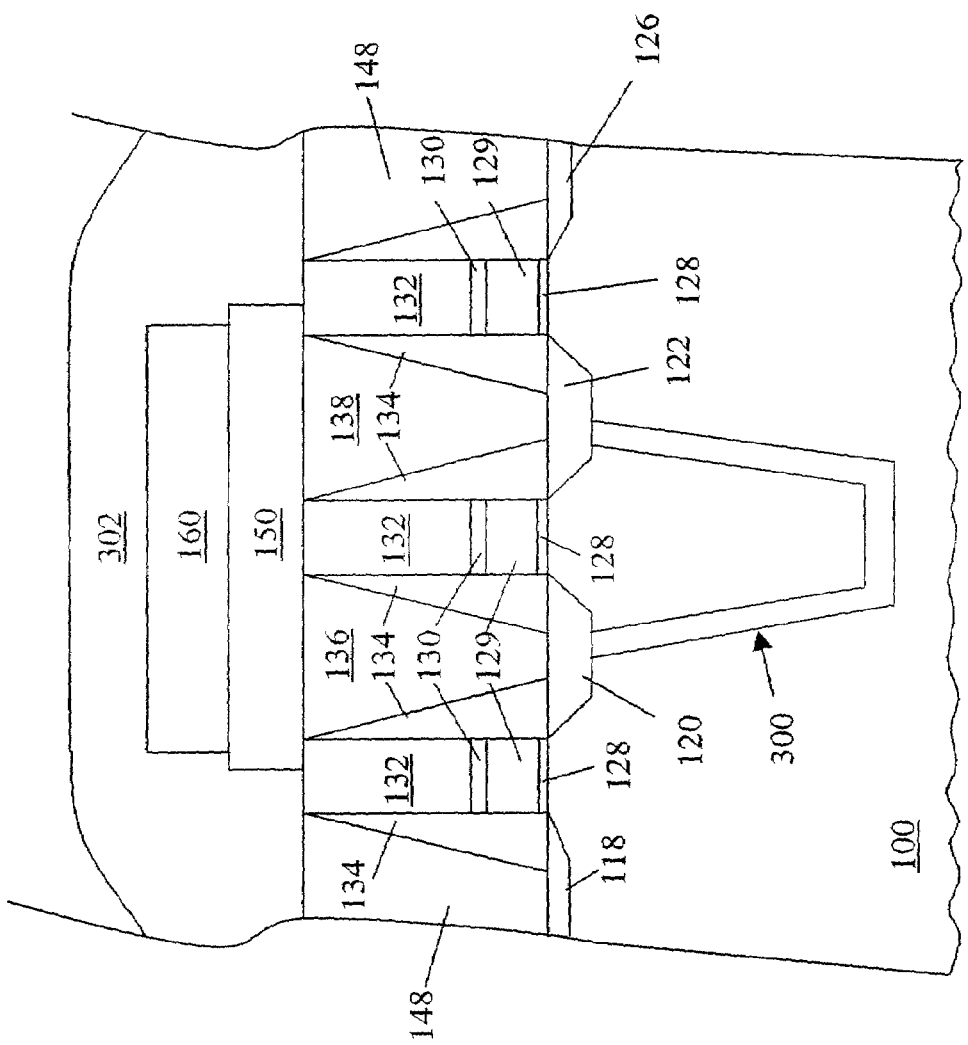
FIG. 21 shows the semiconductor device of FIG. 17 at a processing step subsequent to that shown in FIG. 20 according to an alternate embodiment of the present invention.
Figures 22A, 22B, 22C:
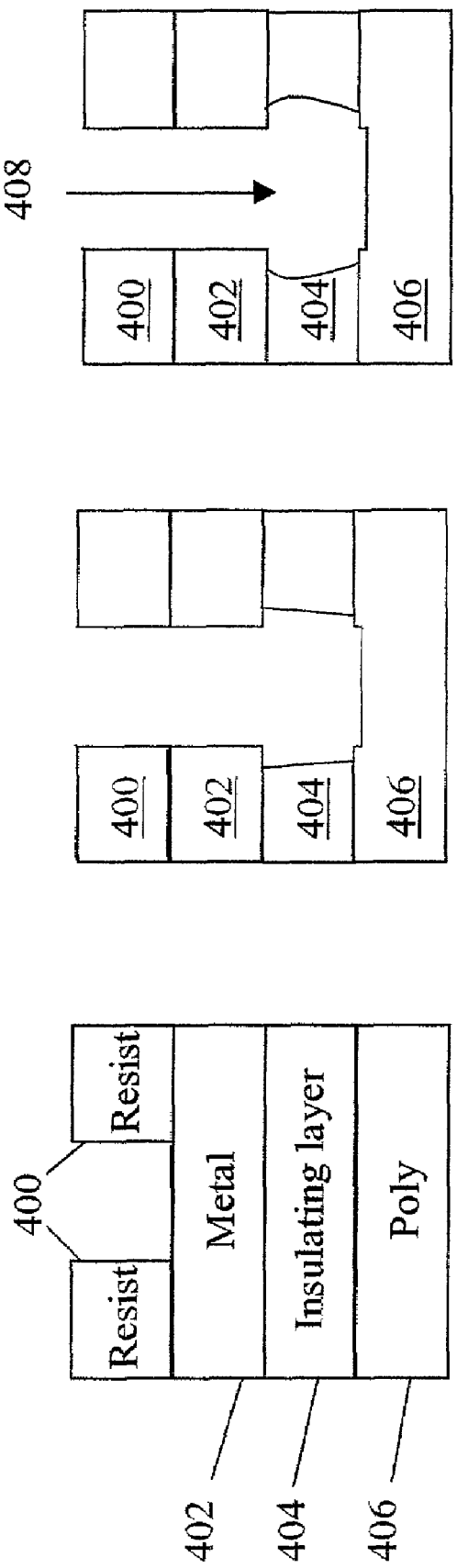
FIGS. 22A, 22B, and 22C depict a conventional etching process resulting in an undercut trench.

As shown by FIG. 20, the photoresist mask 152 is stripped and then a metal deposition pre-clean step is performed. In one embodiment, it is to be appreciated that the pre-clean process further etches the insulating layer 150, as indicated by the dotted lines. In this embodiment, a TEOS insulating layer 150 etches faster than the CVD Ti film layer 160, and without the trimming process discussed above, the Ti film layer 160 is often undercut, which in a subsequent material deposition step, would result in void formation. The subsequent material deposition of a material 302 is illustrated by FIG. 21. The material 302 in one embodiment is a metal or material containing metal. It is to be appreciated that the trimming of the photoresist layer 152 and subsequent additional metal film layer etch results in a terraced film stack which prevents void formation.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

We claim:

1. A method of forming a memory device, said method comprising:
   etching a plurality of material layers using a photoresist provided in a first pattern, said etching defining in said material layers a first cavity having a first width;
   etching said photoresist to provide a second pattern which exposes a low resistance interconnect layer of said material layers;
   etching said low resistance interconnect layer through said second pattern to define a second cavity over said first cavity, said second cavity having a second width larger than said first width;
   removing said photoresist; and
   depositing another material layer over said materials layers to fill said first and second cavities.

2. The method of claim 1, wherein low resistance interconnect layer is a metal layer.

3. The method of claim 1, wherein low resistance interconnect layer is CVD Ti.

4. The method of claim 1, wherein one of said material layers is an insulating layer provided below said low resistance interconnect layer.

5. The method of claim 1, wherein one of said material layers is TEOS provided below said low resistance interconnect layer.

6. The method of claim 1, wherein said another material layer is selected from the group consisting of a metal and a material containing metal.

7. The method of claim 1, wherein said low resistance interconnect layer is Ti provided on an insulating layer of TEOS.

8. The method of claim 1, further comprises performing a pre-cleaning before depositing said another material layer, wherein said pre-cleaning widens the width of said first cavity.

9. The method of claim 1, wherein said plurality of material layers comprises a bit-line and a dielectric, and wherein said method forms a terraced film stack of said low resistance interconnect layer over said bit-line.

10. The method of claim 1, further comprises forming a terraced film stack contact comprising a low-resistivity metal mode titanium layer, tungsten nitride layer, a tungsten layer, a nitride layer, and combinations thereof.

11. The method of claim 1, further comprises forming a terraced film stack contact comprising a metal mode titanium layer deposited with a thickness in a range of about 1 Angstrom to about 5000 Angstroms.

12. The method of claim 1, further comprises forming a terraced film stack contact comprising a tungsten nitride/nitride layer deposited with a thickness in a range of about 5 Angstroms to about 5000 Angstroms.

13. The method of claim 1, further comprises forming a terraced film stack contact comprising a nitride capping layer deposited and planarized to have a thickness in a range of about 100 Angstroms to about 10,000 Angstroms.

14. The method of claim 1, wherein said material layers define a memory array of the memory device.

15. The method of claim 1, wherein said material layers define a peripheral circuitry area the memory device.

16. The method of claim 1, wherein said photoresist is isotropically etched.

17. The method of claim 1, wherein said low resistance interconnect layer is anisotropically etched.

18. The method of claim 1, further comprises performing a pre-cleaning before depositing said another material layer, wherein said pre-cleaning widens the width of said first cavity, wherein said pre-cleaning process is an aqueous or non-aqueous mixture comprising HF and/or $NH_4F$.

19. The method of claim 1, wherein said material layers comprises a trench capacitor and an insulating layer, and wherein said method forms a terraced film stack of said metal layer and said insulating layer over said trench capacitor.

20. The method of claim 1, wherein said low resistance interconnect layer is etched using a plasma etch process.

21. The method of claim 1, wherein said photoresist is etched using an oxygen containing etch process.

* * * * *